United States Patent [19]

Yerman et al.

[11] Patent Number: 4,716,124

[45] Date of Patent: Dec. 29, 1987

[54] TAPE AUTOMATED MANUFACTURE OF POWER SEMICONDUCTOR DEVICES

[75] Inventors: Alexander J. Yerman; James A. Loughran, both of Scotia, N.Y.

[73] Assignee: General Electric Company, Schenectady, N.Y.

[21] Appl. No.: 898,082

[22] Filed: Aug. 20, 1986

Related U.S. Application Data

[62] Division of Ser. No. 616,756, Jun. 4, 1984, Pat. No. 4,635,092.

[51] Int. Cl.⁴ .............................................. H01L 23/26
[52] U.S. Cl. ........................................ 437/8; 437/209; 437/220; 437/222; 357/70; 357/71; 357/81; 174/52 PE; 174/52 FP
[58] Field of Search .................. 29/589, 591, 574, 839, 29/739, 740, 741; 357/70, 81, 71; 174/52 PE, 52 FP

[56] References Cited

U.S. PATENT DOCUMENTS

| | | | |
|---|---|---|---|
| 3,689,991 | 9/1972 | Aird | 29/577 |
| 3,763,404 | 10/1973 | Aird | 174/52 PE |
| 3,846,905 | 11/1974 | Harper | 29/589 |
| 3,872,583 | 5/1975 | Beall et al. | 29/589 |
| 4,234,666 | 11/1980 | Gursky | 357/80 |
| 4,316,320 | 2/1982 | Nogawa et al. | 29/839 |
| 4,459,607 | 7/1984 | Reid | 357/80 |
| 4,538,170 | 8/1985 | Yerman | 357/80 |
| 4,556,899 | 12/1985 | Kurihara et al. | 357/80 |
| 4,595,945 | 6/1986 | Graver | 357/68 |
| 4,630,355 | 12/1986 | Johnson | 29/574 |
| 4,635,092 | 1/1987 | Yerman et al. | 29/577 |

OTHER PUBLICATIONS

T. G. O'Neil, "The Status of Tape Automated Bonding", Semiconductor International (Feb. 1981), pp. 33–51 (with advertisements omitted).

J. Lyman, "Tape Automated Bonding Meets VLSI Challenge", Electronics (Dec. 18, 1980), pp. 100–105.

Primary Examiner—Brian E. Hearn
Assistant Examiner—Beverly A. Pawlikowski
Attorney, Agent, or Firm—Bernard J. Lacomis; James C. Davis, Jr.

[57] ABSTRACT

Power semiconductor devices are manufactured using a flexible metal tape carrier to facilitate automation of the manufacturing process. Control leads are fashioned from portions of the tape carrier, with a main portion of the tape carrier serving as a main current lead. The manufacturing process permits thorough electrical testing of a power semiconductor chip prior to incorporation into a relatively expensive power device package. In particular, the power chip can be tested at full-rated current, at least where the current is pulsed at a low duty cycle.

13 Claims, 12 Drawing Figures

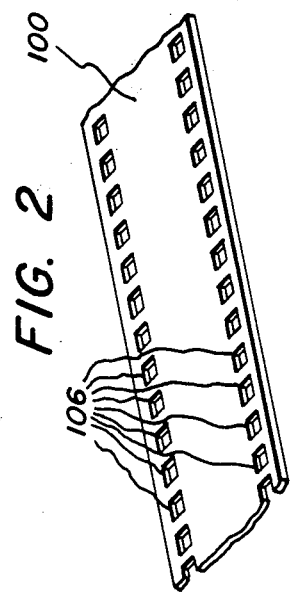
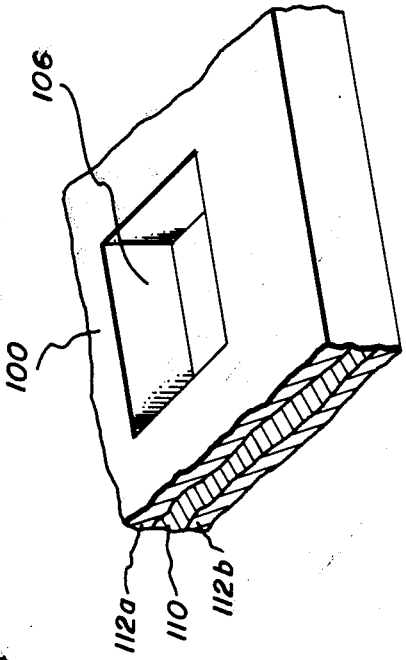
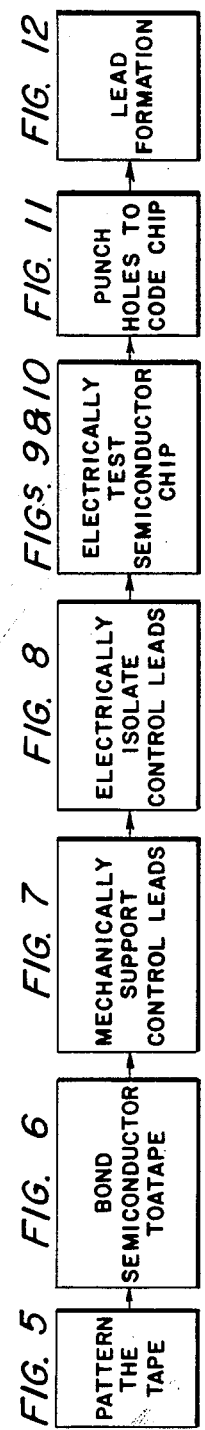

TAPE AUTOMATED MANUFACTURE OF POWER SEMICONDUCTOR DEVICES

This application is a division, of application Ser. No. 616,756, filed June 4, 1984 now U.S. Pat. No. 4,635,092.

BACKGROUND OF THE INVENTION

The present invention relates to a manufacturing process for a power semiconductor device, which utilizes a flexible metal tape carrier for automation purposes, and also to power semiconductor devices produced from such manufacturing process.

Manufacturing of semiconductor devices typically includes the attachment of electrical leads to the electrodes of a semiconductor chip. To avoid the expense of labor-intensive joining of electrical leads to electrodes of a chip, a Tape Automated Bond (TAB) process has been developed for "signal" chips, such as used in digital watches or calculators. In the TAB process, a flexible tape carrier is used in the formation of electrical leads for individual signal chips. In particular, the flexible tape comprises a non-conducting, plastic main layer with a thin copper layer, typically of 1.3 mils (0.0013-inch) thickness, atop the plastic layer. Electrical leads for the signal chips are provided through appropriate configuration of the thin copper layer atop the plastic layer.

The unique requirements of power semiconductor chips, which typically dissipate heat in excess of about 10 watts per $cm^2$, preclude the use of tape carriers used in the TAB process for manufacturing signal level semiconductor devices. This is because (1) the copper on the TAB flexible tape carriers is not sufficiently thick to accommodate the large currents of power semiconductor chips, and (2) the large size of typical power semiconductor chips, which may reach dimensions as large as 0.750 inches, results in a severe thermal expansion mismatch between the tape carrier and the power chip, thereby placing the power chip in danger of warping or fracturing.

If the copper layer on the TAB tape carriers is increased in thickness so as to handle the large currents of power semiconductor chips, the thermal mismatch between tape carrier and chip is aggravated.

It would thus be desirable to provide a tape automated manufacturing process accommodating the requirements of power semiconductor devices.

The manufacturing of power semiconductor devices can also greatly benefit from permitting full electrical testing of power chips prior to their being incorporated in a relatively expensive device package. This is especially true where power chips are paralleled in a circuit to provide high current capacity, since one defective power chip in a paralleled arrangement would render the entire assembly useless.

OBJECTS OF THE INVENTION

It is, accordingly, an object of the present invention to provide a tape automated manufacturing process for power semiconductor devices.

A further object of the invention is to provide a tape automated manufacturing process for power semiconductor devices in which selected leads for a power semiconductor chip can be fashioned from portions of the tape carrier utilized.

Another object of the present invention is to provide a power semiconductor device manufacturing process wherein full electrical testing of power chips can be performed prior to their incorporation in device packages.

A still further object of the invention is to provide a power semiconductor device manufacturing process in which power chips can be tested at their full-rated current without danger of overheating prior to their incorporation in power device packages.

SUMMARY OF THE INVENTION

In accordance with a preferred process for manufacturing a power semiconductor device, a metal tape carrier, preferably of multilayered, or composite, construction, is provided and includes a series of sprocket holes adapted to be engaged by a drive mechanism for automated movement of the tape carrier. A plate-shaped power semiconductor chip is provided and, in preferred form, includes a first main current electrode on a first major chip surface and a second main current electrode and at least one control electrode on a second major chip surface. A control lead is formed from a portion of the metal tape carrier by selectively removing metal from the metal tape to define part of the lateral periphery of the control lead, with a selected portion of the control lead lateral periphery remaining intact, however, so as to anchor the control lead to the remainder of the metal tape. The power chip's second main current electrode and control electrode are then respectively bonded to a main current portion of the metal tape and to the control lead by soldering.

To permit electrical testing of the power semiconductor chip, a main electrical contact is pressed against the chip's first main electrode and an opposing main electrical contact is pressed against the opposite-facing portion (i.e., the backside) of the metal tape. The main electrical contact pressed against the chip first main electrode constitutes a heat sink for removal of heat from the chip during chip testing. An electrical control contact is pressed against the control lead whereby electrical testing of the power semiconductor chip can be carried out.

After electrical testing of the power semiconductor chip, a second main current lead is formed from the metal tape by severing from the tape a portion bonded to the chip's second main current electrode.

A preferred power semiconductor device according to the present invention includes a multilayered, or composite, metal tape including a series of sprocket holes adapted to be engaged by a drive mechanism for automated movement of the metal tape. The metal tape includes a control lead electrically isolated from the main current portion of the metal tape. A plate-shaped power semiconductor device is included and has a first main current electrode on a first major chip surface and a second main current electrode and also a control electrode on a second major chip surface. The second main current electrode is solder-bonded to a main current portion of the metal tape while the control electrode is solder-bonded to the control lead of the tape.

BRIEF DESCRIPTION OF THE DRAWINGS

The features of the invention deemed to be novel are defined in the appended claims. The invention itself, however, both as to organization and method of operation, together with further objects and advantages thereof, may be best understood with reference to the following description when read in conjunction with the accompanying drawings, in which:

FIG. 1 is a simplified view of a metal tape carrier system utilized in the power semiconductor device manufacturing process of the present invention;

FIG. 2 illustrates a segment of the metal tape carrier of the FIG. 1 system depicting, in particular, sprocket holes used to facilitate automated movement of the tape;

FIG. 3 is a detail view of the metal tape carrier used in the present invention with a preferred, composite structure being depicted;

FIG. 4 is a block diagram flow chart outline of the semiconductor device manufacturing process of the present invention, with pertinent drawing figures indicated above the respective blocks;

DESCRIPTION OF THE PREFERRED EMBODIMENTS

Figure 5:
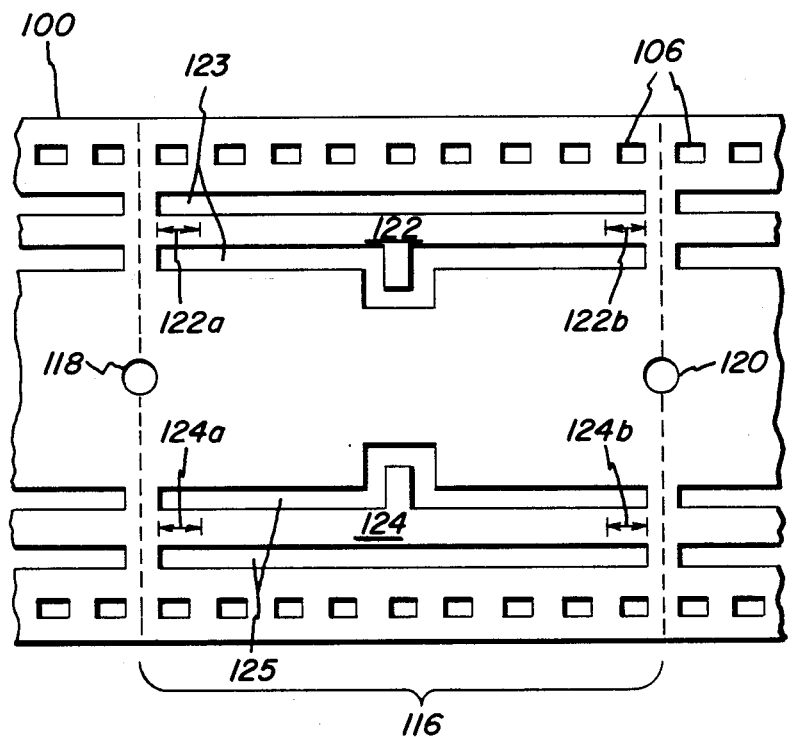
FIGS. 5-8 illustrate various manufacturing steps culminating in the bonding of a power chip to a metal tape carrier.

With reference to the drawings, FIG. 1 diagrammatically illustrates a metal tape carrier system, including a flexible, metal tape carrier 100, a storage reel 102 and a take-up reel 104. Tape carrier 100, as hereinafter described more fully, is suitably patterned into electrical leads for power semiconductor chips which are then mounted on the tape carrier to facilitate manufacturing and testing of power semiconductor devices.

FIG. 2 illustrates a segment of tape carrier 100 that includes sprocket holes 106, which are preferably located near the lateral edges of tape carrier 100 as shown, and which are adapted to be engaged by a drive mechanism (not shown) for transporting the tape carrier from storage reel 102 (FIG. 1) to take-up reel 104.

Tape carrier 100 (FIG. 2) comprises electrically-conductive metal whereby current can flow therethrough from one major surface to the other. Close thermal expansion matching between tape carrier 100 and power semiconductor chips (not shown) to be mounted on the tape carrier is preferably achieved by employing a multilayered, or composite, construction for tape carrier 100, as is illustrated in the detail view of FIG. 3. Tape carrier 100, in preferred form, comprises a central portion 110 and upper and lower layers 112a and 112b, respectively, clad onto central portion 110. Central portion 110 preferably comprises a conductive metal with a thermal expansion coefficient no greater than about twice that of power semiconductor chip 128. Where chip 128 comprises silicon, tape central portion 110 suitably comprises a nickel-iron alloy designated as "A42" by the American Society of Testing Materials (ASTM). The A42 alloy central layer 100 is suitably about 3.5 mils (0.0035 inch) in thickness but may be as thick as about 7.0 mils (0.007 inch), for example. Layer 112a atop layer 110 and layer 112b beneath layer 110 each typically comprises 0.5 mils (0.0005 inch) of copper, although the thicknesses of layers 112a and 112b preferably range from 0.3 to 1.0 mils (0.0003 to 0.0010 inch), with these layers each being about 1/7th the thickness of central layer 110. The thermal expansion characteristic of tape carrier 100, accordingly, is predominantly determined by the thermal expansion characteristic of central layer 110, while the thinner layers 112a and 112b provide readily-solderable surfaces and reduce the electrical resistance of metal tape carrier 100.

As an alternative to a multilayered construction for tape carrier 100, a single layer of metal with a thermal expansion coefficient preferably no greater than about twice that of power chip 128 may be used to implement the tape carrier. By way of example, molybdenum would be a suitable metal where the power chip comprises silicon.

A preferred manufacturing process for power semiconductor devices is outlined in the block diagram, flow chart of FIG. 4, with each block being referenced to the respective drawing figure or figures illustrating the step described in the respective block.

FIG. 5 illustrates the patterning of tape carrier 100 for accommodating an exemplary power semiconductor chip comprising a 50-amp power Darlington transistor (General Electric type ZJ-544). Only those features of tape carrier 100 within a repeated pattern 116 are hereinafter described. A control lead 122 is formed in tape carrier 100 by removal of metal from locations 123, to form slots in the tape carrier, which may be accomplished through mechanical punching technique or conventional wet chemical etching technique, by way of example. Slots 123 define the lateral periphery of control lead 122 except for selected locations 122a and 122b which are left intact so as to anchor control lead 122 to the remainder of tape carrier 100. A second control lead 124 is formed in similar fashion as control lead 122 by providing slots 125 in metal tape 100 while leaving portions 124a and 124b intact to anchor lead 124 to metal tape carrier 100.

Figure 6:
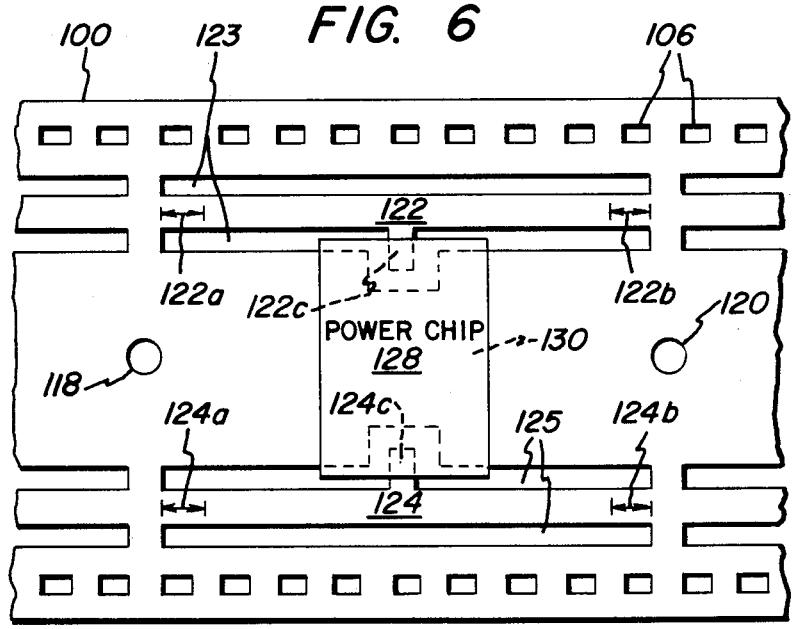

As next shown in FIG. 6, a power chip 128, schematically illustrated, is positioned over tape carrier 100. If desired, tape carrier 100 can be electrolessly tin-plated prior to the FIG. 6 step to enhance the solderability of the tape carrier. Power chip 128 has a downwardly-facing main current electrode (not shown) and a pair of control electrodes (not shown) that are preferably solder-bumped (i.e., provided with bumps of solder) and are preferably held in position against corresponding leads of tape carrier 100 by solder paste. Specifically, with power chip 128 comprising a power Darlington transistor, a main current electrode, in particular an emitter electrode (not shown) of chip 128, makes contact with portion 130 of tape carrier 100, herein designated as a main current portion of tape carrier 100, while first and second base electrodes (not shown) of chip 128 make contact with control lead portions 122c and 124c, respectively. A solder preform is advantageously placed atop power chip 128, on the main current, collector electrode (not shown) of the chip to facilitate attachment of an electrical lead (not shown) to the collector electrode when power chip 128 is subsequently incorporated into a semiconductor package. Tape carrier 100 with power chip 128 positioned thereon is then heated, preferably in an inert atmosphere, to actuate solder bonds between the chip and the tape carrier, heat suitably being supplied from a hot plate arrangement or furnace, by way of example.

Figure 7:
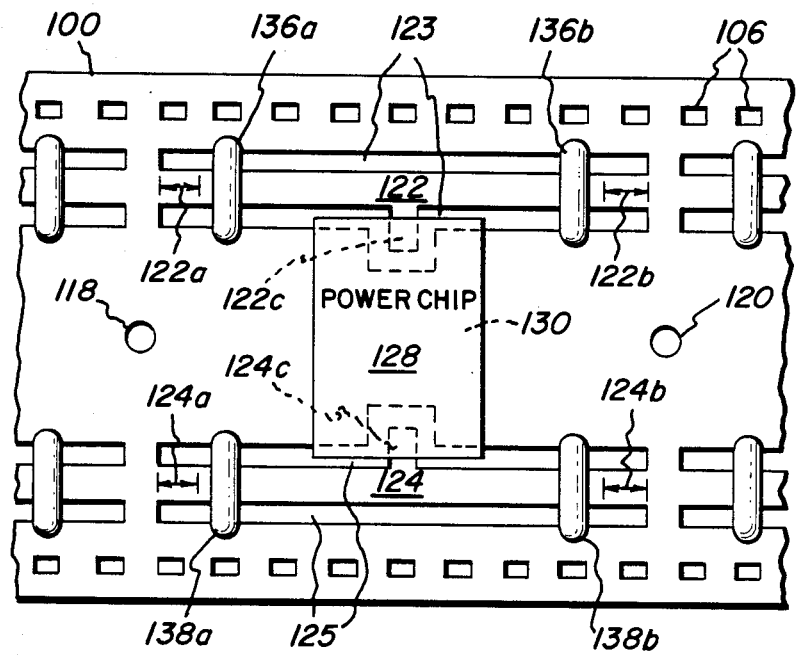

As next depicted in FIG. 7, control lead 122 is preferably mechanically supported, or held in a substantially fixed relation to, tape carrier 100, by dielectric material 136a and 136b, such as an ultraviolet-curable polymer or a heat-curable polymer, such as epoxy. This technique prevents undesirable deformation of control lead 122. Similarly, control lead 124 is preferably supported mechanically by dielectric material 138a and 138b, also suitably being an epoxy, for example.

Figure 8:
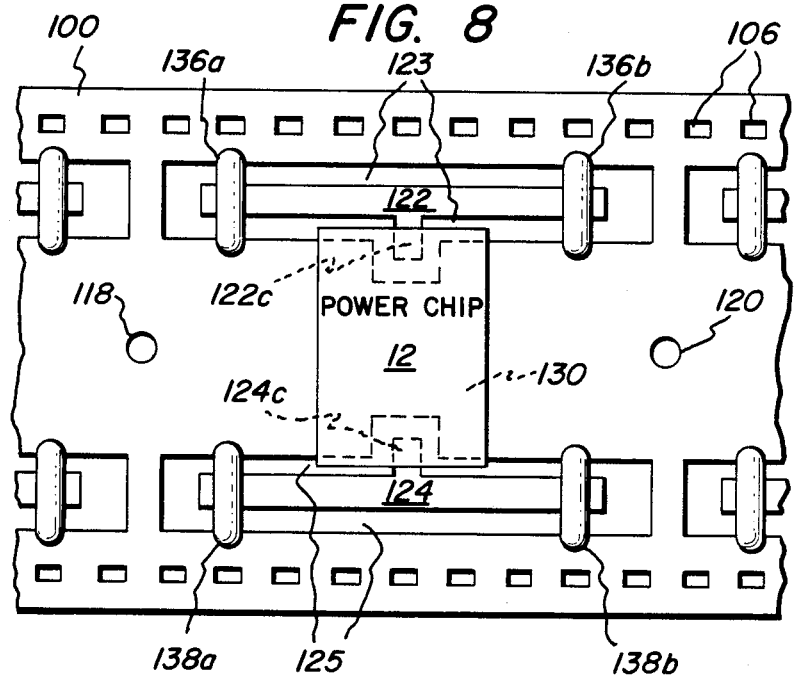

As depicted in FIG. 8, control leads 122 and 124 are electrically isolated from the remainder of tape carrier 100 by the removal from the control leads of anchor portions 122a-122b and 124a-124b (FIG. 7). This may be accomplished by mechanically punching out the anchor portions of the control leads, for example.

Figure 9:
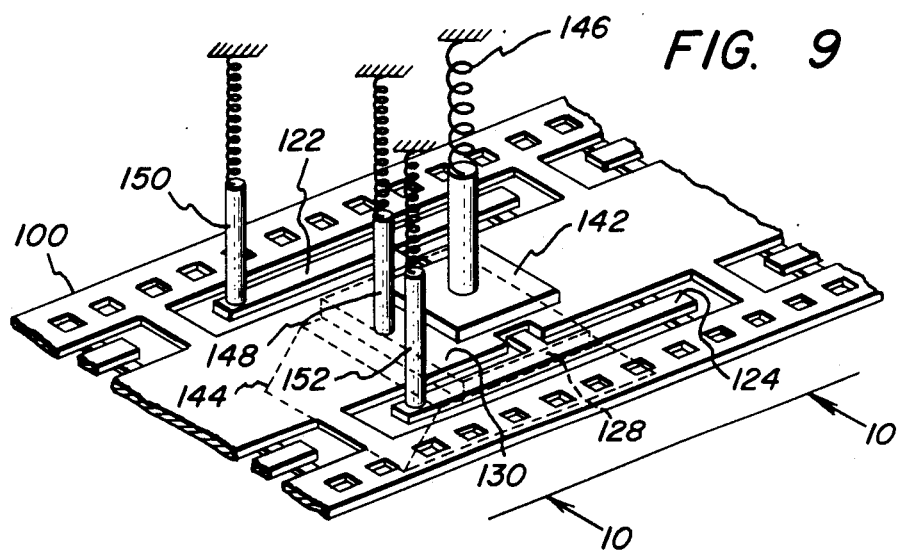
FIGS. 9 and 10 depict an electrical contact arrangement used to carry out electrical testing of a power chip bonded to a metal tape carrier.

The present semiconductor device manufacturing process permits electrical testing of power chip 28 once control leads 122 and 124 are electrically isolated from the remainder of tape carrier 100. To carry out electrical testing of chip 128, the chip, along with the patterned tape carrier as illustrated in FIG. 8, is inserted between opposing electrical contacts depicted in FIG. 9. The view of FIG. 9 is taken from beneath tape carrier 100 to facilitate viewing of details of the testing contact arrangement, with power chip 128 therein being shown as facing downwards.

To permit electrical testing at or near the full-rated current of power chip 128, a main current electrical contact 142 is pressed against main current section 130 of tape carrier 100, while a second main current electrical contact 144, opposing contact 142, is pressed against the otherwise exposed, downwardly-facing main current electrode (not shown) of chip 128. As schematically illustrated in FIG. 9, main electrical contacts 142 and 144 are pressed together via a spring 146, which provides a resilient force preferably exceeding 10 pounds per square inch. Other means for pressing together contacts 142 and 144 will be apparent to those skilled in the art.

Figure 10:
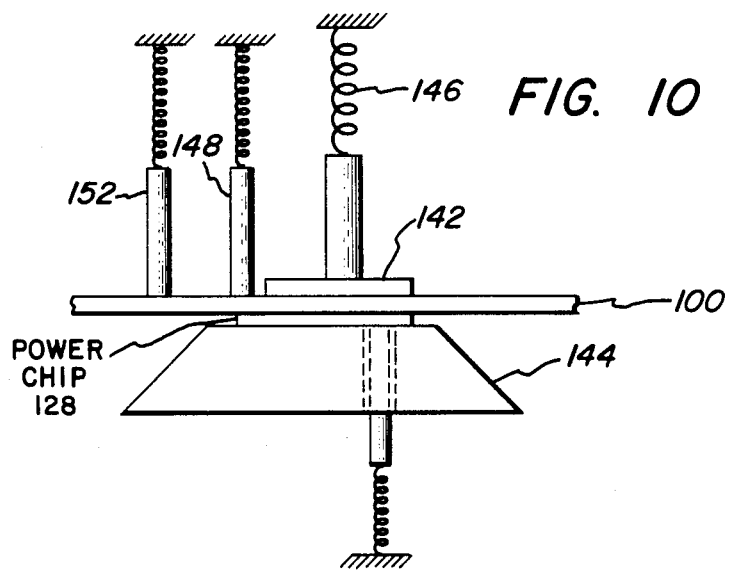

As more easily seen in FIG. 10, main electrical contact 144 has considerable bulk; this is because it functions as a heat sink to draw heat away from power chip 128 at high current testing of the chip. Main current electrode contact 144 preferably comprises aluminum with a thermal resistance of less than 1.0° C. per watt to accomplish its heat sinking function.

Main current electrical contacts 142 and 144 are of large area in order to accommodate large current flow therethrough and typically each has a contact area in excess of about 1.0 cm².

Considering FIG. 9, a small area electrical contact 148, which conducts only low levels of current, is pressed against main current section 130 of tape carrier 100, for sensing the voltage of the main current section. Contact 148 provides a means for sensing voltage drops across power chip 128 which excludes that due to contact resistance and is known in the art as a "kelvin" contact. Further small area contacts 150 and 152 are shown pressed against control leads 122 and 124, respectively, for providing base drive currents to these leads and also for sensing the voltages of the leads.

The electrical testing arrangement of FIGS. 9 and 10 permits electrical testing of power Darlington chip 128 for such parameters as direct current (DC) current gain ($h_{FE}$), collector-to-emitter saturation voltage $V_{CE(SAT)}$, collector-to-emitter avalanche breakdown voltage for an open base ($V_{CEO}$) and for a resistance connection between base and emitter ($V_{CER}$), emitter-to-base breakdown voltage ($V_{EBO}$), and the sustaining voltage measure of ($V_{CEO(SUS)}$). Of particular significance is that the foregoing testing arrangement makes it possible to test for direct current gain, $h_{FE}$, at full-rated device current, at least for a low duty cycle pulse testing of less than 5 percent, for example.

Figure 11:
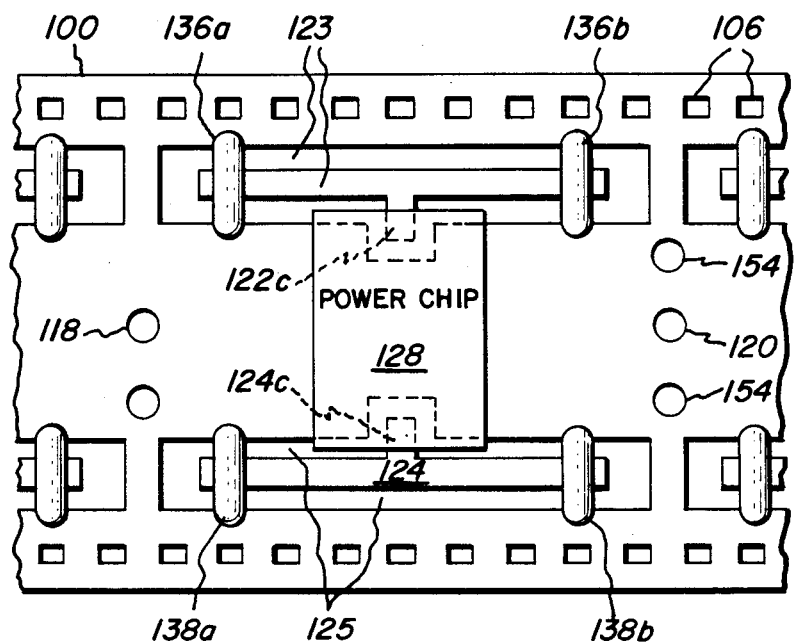
FIGS. 11 and 12 depict additional, preferred processing steps in the manufacture of a power semiconductor device by the process of the present invention.

Following the electrical testing of power chip 128, the chip can be coded as to the quality of its electrical characteristics as depicted in FIG. 11, in which the chip faces upwards. This is suitably accomplished by providing code indicia in tape carrier 100 as, for example, by punching code holes 154 adjacent reference hole 120.

Figure 12:
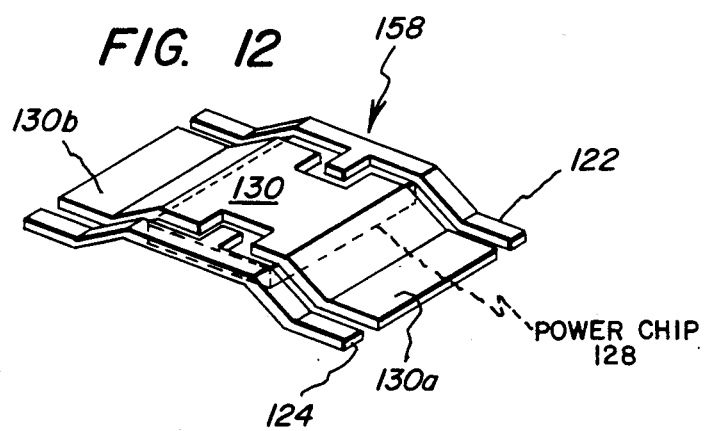

Considering lastly FIG. 12 in which power chip 128 faces downwards, as a final step in producing a semiconductor device 158, which includes power chip 128, main current section 130 of tape carrier 100, together with extensions 130a and 130b of the tape carrier on either side of main current section 130, are sliced or otherwise severed from the remainder of the tape carrier, control leads 122 and 124 having already been severed. Control leads 122 and 124 and the main current lead 130 are then preferably configured into a desired shape for use in a semiconductor package (not shown) incorporating power device 128.

While the power semiconductor chip described herein has been specified in an exemplary case as constituting a power Darlington transistor, numerous other plate-shaped power semiconductor chips, such as power field-effect transistors, may be utilized. In the particular situation wherein the power chip does not have a control electrode, as in the case of a power P-N rectifier, the above-described manufacturing process is simplified since there is no need for forming a control lead in the tape carrier.

The foregoing describes a power semiconductor device manufacturing process having automated features for cost reduction. The process permits thorough electrical testing of power chips prior to their being incorporated into a relatively expensive semiconductor device package. In particular, the power chips may be tested at full-rated current by pulsing the current at a low duty cycle. Power semiconductor devices produced by the foregoing manufacturing process are also described.

While only preferred features of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. A process for manufacturing a power semiconductor device comprising the steps of:
    (a) providing a metal tape carrier including a series of sprocket holes adapted to be engaged by a drive mechanism for automated movement of said tape carrier;
    (b) providing a plate-shaped power chip having a first main current electrode on a first major chip surface and a second main current electrode and at least one control electrode on a second major chip surface, respectively;
    (c) bonding said second main current electrode to a major surface of said metal tape carrier; and
    (d) forming a control lead for contact with said control electrode, said control lead being formed from said tape carrier by severing and electrically isolating an elongated portion of said carrier from the remainder of said carrier.

2. The power semiconductor device manufacturing process of claim 1 further including the feature of electrical testing of said semiconductor chip, comprising the steps of:

(a) pressing a first electrical contact against said first main electrode, a second electrical contact against said control lead and a third electrical contact against said tape carrier; and (b) testing said power semiconductor chip by monitoring electrical conditions intermediate said contacts.

3. The power semiconductor device manufacturing process of claim 2 further comprising the step of:

providing on said tape carrier indicia recording a result of said step of electrically testing said chip.

4. The power semiconductor device manufacturing process of claim 1 further comprising the step of:

configuring said second control lead into a desired shape for use in a semiconductor package.

5. The power semiconductor device manufacturing process of claim 1 wherein the step of providing a metal tape carrier includes providing a metal tape carrier comprising a metal central portion having a thermal expansion coefficient no greater than about twice that of said power semiconductor chip.

6. The power semiconductor device manufacturing process of claim 5 wherein the step of providing a metal tape carrier further comprises providing a respective, relatively-higher electrical conductivity metal layer on each major side of said metal central portion.

7. A process for manufacturing a power semiconductor device comprising the steps of:

(a) providing a metal tape carrier including a series of sprocket holes adapted to be engaged by a drive mechanism for automated movement of said tape carrier;

(b) providing a plate-shaped power semiconductor chip including a first main current electrode on a first major chip surface and a second main current electrode and at least one control electrode on a second major chip surface;

(c) forming a control lead in said tape carrier by removing selected portions of said tape carrier to define part of the lateral periphery of said control lead with at least one selected portion of the control lead lateral periphery remaining intact so as to anchor the control lead to the remainder of said tape carrier;

(d) bonding said second main current electrode and said control electrode to a main current section of said tape carrier and to said control lead, respectively;

(e) removing said selected portion of said control lead lateral periphery so as to electrically isolate said control lead from the remainder of said tape carrier; and (f) forming a second main current lead from said metal tape by severing from said tape said main current section of said tape carrier and at least one extension thereof.

8. The power semiconductor device manufacturing process of claim 7 further including the feature of electrical testing of said semiconductor chip, comprising the steps of:

(a) pressing a minimum of a pair of opposing main electrical contacts against said first main electrode and said main current section of said tape carrier, respectively, the main electrical contact pressed against said first main electrode constituting a heat sink for removal of heat from said power semiconductor chip; and (b) electrically testing said power semiconductor chip.

9. The power semiconductor device manufacturing process of claim 8 further comprising, prior to the step of severing said selected portion of the control lead lateral periphery, the step of:

dielectrically supporting said control lead in a substantially fixed relation to the remainder of said tape carrier.

10. The power semiconductor device manufacturing process of claim 7 further comprising, prior to the step of severing said selected portion of the control lead lateral periphery, the step of:

dielectrically supporting said control lead in a substantially fixed relation to the remainder of said tape carrier.

11. The power semiconductor device manufacturing process of claim 7 further comprising the step of:

configuring said second main current lead and said control lead into respective, desired shapes for use in a semiconductor package.

12. The power semiconductor device manufacturing process of claim 7 wherein the step of providing a metal tape carrier includes providing a metal tape carrier comprising a metal central portion having a thermal expansion coefficient no greater than about twice that of said power semiconductor chip.

13. The power semiconductor device manufacturing process of claim 12 wherein the step of providing a metal tape carrier further comprises providing a respective, relatively-higher electrical conductivity metal layer on each major side of said metal central portion.

* * * * *